(12) United States Patent
Araki

(10) Patent No.: US 7,410,906 B2
(45) Date of Patent: Aug. 12, 2008

(54) FUNCTIONAL DEVICE AND METHOD FOR PRODUCING THE SAME, AND IMAGE PICKUP DEVICE AND METHOD FOR PRODUCING THE SAME

(75) Inventor: Yasushi Araki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/180,643

(22) Filed: Jul. 14, 2005

(65) Prior Publication Data
US 2006/0108658 A1 May 25, 2006

(30) Foreign Application Priority Data
Jul. 16, 2004 (JP) ............ P.2004-209902

(51) Int. Cl.
*H01L 21/302* (2006.01)
*H01L 21/461* (2006.01)
(52) U.S. Cl. .................... 438/734; 438/738
(58) Field of Classification Search ............ None
See application file for complete search history.

(56) References Cited

U.S. PATENT DOCUMENTS

| | | | | | |
|---|---|---|---|---|---|
| 5,318,664 | A | * | 6/1994 | Saia et al. .............. | 216/67 |
| 5,366,588 | A | * | 11/1994 | Scholten et al. ......... | 216/101 |
| 5,793,047 | A | * | 8/1998 | Kobayashi et al. ...... | 250/370.09 |
| 6,235,641 | B1 | * | 5/2001 | Christenson ............ | 438/706 |
| 6,407,004 | B1 | * | 6/2002 | Kimura et al. .......... | 438/720 |
| 2001/0036680 | A1 | * | 11/2001 | Higashi et al. ......... | 438/30 |
| 2002/0079802 | A1 | * | 6/2002 | Inoue et al. ............ | 313/309 |
| 2003/0141807 | A1 | * | 7/2003 | Kawase ................. | 313/498 |

* cited by examiner

*Primary Examiner*—Evan Pert
*Assistant Examiner*—Ben P Sandvik
(74) *Attorney, Agent, or Firm*—Sughrue Mion, PLLC

(57) ABSTRACT

A method of producing a functional device comprising an electrode layer provided as an upper layer of a layer containing an organic material, the layer being as a functional layer, wherein a step of patterning the electrode layer comprises a high speed etching step of etching the electrode layer at a rate of 10 nm/min or more.

16 Claims, 3 Drawing Sheets

FUNCTIONAL DEVICE AND METHOD FOR PRODUCING THE SAME, AND IMAGE PICKUP DEVICE AND METHOD FOR PRODUCING THE SAME

BACKGROUND OF THE INVENTION

This application is based on Japanese patent application JP 2004-209902, filed on Jul. 16, 2004, the entire content of which is hereby incorporated by reference, the same as if set forth at length.

1. Field of the Invention

The present invention relates to a functional device and a method for the production thereof and a solid-state image pickup device and a method for the production thereof and more particularly to a photoelectric conversion element comprising a photoelectric conversion layer containing an organic material and a light-transmitting electrode stacked on the photoelectric conversion layer and a solid-state image pickup device comprising such a photoelectric conversion element and a method for the production thereof.

2. Description of the Related Art

A prototype device of a photoelectric conversion layer stacked type solid-state image pickup device is, for example, one described in JP-A-58-103165. This solid-state image pickup device is constructed such that three layers of photosensitive layers are stacked on a semiconductor substrate; and respective red (R), green (G) and blue (B) electric signals as detected in the respective photosensitive layers are read out by a MOS circuit formed on the surface of the semiconductor substrate.

Though the solid-state image pickup device having such a construction was proposed in the past, a CCD type image sensor and a CMOS type image sensor in which a number of light receiving parts (photodiodes) are integrated in a surface portion of a semiconductor substrate and respective red (R), green (G) and blue (B) color filters are stacked on the respective light receiving parts have extremely progressed. At present, an image sensor having several millions light receiving parts (pixels) integrated on one chip has been mounted in a digital still camera.

However, with respect to the CCD type image sensor or CMOS type image sensor, the technical progress reaches the vicinity to limits, and the size of the light receiving region (opening) of one light receiving part is about 2 μm and becomes closed to the order of a wavelength of incident light, resulting in facing a problem that the production yield is poor.

Further, an upper limit of the quantity of photoelectric charges to be accumulated in one miniaturized light receiving part is low as about 3,000 in terms of the number of electrons, so that it becomes difficult to express 256 gradations. For this reason, it is difficult to expect to realize more properties in the image quality and sensitivity by the related art CCD type or CMOS type image sensors.

Then, as a solid-state image pickup device for solving these problems, the structure of the solid-state image pickup device as proposed in JP-A-58-103165 is given a second look, and image sensors as described in Japanese Patent No. 3,405,099 and JP-A-2002-83946 are newly proposed.

The image sensor as described in Japanese Patent No. 3,405,099 is constructed such that an ultra-fine particle of silicon is dispersed in a medium to form a photoelectric conversion layer; three layers of plural photoelectric conversion layers having a varied particle size of the ultra-fine particle are stacked on a semiconductor substrate; and electric signals are generated in the respective photoelectric conversion layers corresponding to the respective light receiving quantities of red, green and blue colors.

This applies also to the image sensor disclosed in JP-A-2002-83946. This image sensor comprises three nanosilicon layers composed of particles having different particle diameters stacked on a semiconductor substrate. This image sensor is arranged such that red, green and blue electric signals detected by the respective nanosilicon layer are read out by storage diodes formed on the surface of the semiconductor substrate.

In order to stack a photoelectric conversion layer having such a configuration on a semiconductor substrate, two light-transmitting electrodes are stacked with the respective photoelectric conversion layer provided interposed therebetween. This light-transmitting electrode may need to be patterned as necessary. As ordinary methods of patterning a light-transmitting electrode there have been proposed methods disclosed in JP-A-2000-150466 and JP-A-2000-150467.

For the sake of putting a photoelectric conversion layer stacked type solid-state image pickup device into practical use, it is necessary to solve a problem on what materials are to be used for forming a photoelectric conversion layer. In the related art technologies as described in Japanese Patent No. 3,405,099 and JP-A-2002-83946, the photoelectric conversion layer is made of an ultra-fine particle of silicon or constructed of a nano-silicon layer. However, more actually, it may be said to be preferable that the photoelectric conversion layer is made of an existing material, for example, an organic material such as organic semiconductors.

However, there arises a problem that when a photoelectric conversion layer containing an organic material and a light-transmitting electrode are stacked on a semiconductor substrate and the light-transmitting electrode is then subjected to patterning according to the method disclosed in JP-A-2000-150466 and JP-A-2000-150467, the resulting photoelectric conversion layer exhibits deteriorated photoelectric conversion characteristics, making it impossible to take images having a high resolution.

SUMMARY OF THE INVENTION

The invention has been worked out under these circumstances. An aim of the invention is to produce a functional device having a high reliability without causing the deterioration of the characteristics of the functional layer containing an organic material.

Another aim of the invention is to provide a functional device comprising a stack of a photoelectric conversion layer containing an organic material and a light-transmitting electrode without causing the deterioration of the photoelectric conversion characteristics of the photoelectric conversion layer and a method for the production thereof.

The method of producing a functional device of the invention is a method of producing a functional device comprising an electrode layer provided as an upper layer of a layer containing an organic material, the layer being as a functional layer, wherein a step of patterning the electrode layer comprises a high speed etching step of etching the electrode layer at a rate of 10 nm/min or more.

By this method, it is possible to prevent the deterioration of photoelectric conversion characteristics of the functional device.

In the method of producing a functional device according to the invention, an etchant gas to be used in the high-speed etching step comprises at least one of HI, HBr, HCl, $CH_4$, and $CH_3OH$.

By this method, it is possible to prevent the deterioration of photoelectric conversion characteristics of the functional device.

In the method of producing a functional device according to the invention, the light-transmitting electrode comprises at least one of ITO, IZO, $SnO_2$, ATO, ZnO, and FTO.

By this method, it is possible to prevent the deterioration of photoelectric conversion characteristics of the functional device.

In the method of producing a functional device according to the invention, the high-speed etching step is terminated while remaining a prescribed amount of the light-transmitting electrode, and the patterning step comprises a low-speed etching step for etching the remaining light-transmitting electrode after the high-speed etching step at a rate lower than the etching rate in the high-speed etching step.

By this method, it is possible to prevent the deterioration of photoelectric conversion characteristics of the functional device.

In the method of producing a functional device according to the invention, an etchant gas to be used in the low-speed etching step comprises at least one of HI, HBr, HCl, $CH_4$, $CH_3OH$, $BCl_3$, and $Cl_2$.

By this manner, the deterioration of the photoelectric conversion characteristics of the functional device can be prevented, making it possible to enhance the reliability thereof. In the case where a reducing gas such as HCl is included in particular, patterning can be effected while reducing the precipitates during dry etching. Further, there occurs no deterioration of element characteristics due to precipitation of reaction products.

In the method of producing a functional device of the invention, the light-transmitting electrode comprises a first light-transmitting electrode and a second light-transmitting electrode stacked on the first light-transmitting electrode, the high speed etching step involves etching of the second light-transmitting electrode and the low speed etching step involves etching of the first light-transmitting electrode.

By this manner, the deterioration of the photoelectric conversion characteristics of the functional device can be prevented.

In the method of producing a functional device of the invention, the first light-transmitting electrode has an etching resistance to an etchant containing halogen.

By this manner, the deterioration of the photoelectric conversion characteristics of the functional device can be prevented.

In the invention, the high speed or low speed etching step may involve a step of drying etching with at least one gas selected from HCl, HBr and HI.

In this arrangement, the reliability of the functional device can be enhanced. In the case where a reducing gas such as HCl is included in particular, patterning can be effected while reducing the precipitates during dry etching. Further, there occurs no deterioration of device characteristics due to precipitation of reaction products.

In the invention, the high speed or low speed etching step may involve a step of dry etching with at least one gas selected from $CH_4$ and $CH_3OH$.

In this arrangement, the reliability of the functional device can be enhanced. Patterning can be effected while reducing the precipitates during dry etching in particular to allow slow progress of reaction. Further, there occurs no deterioration of device characteristics due to precipitation of reaction products.

In the invention, the low speed etching step may involve a step of dry etching with at least one gas selected from Ar and $N_2$.

In this arrangement, the reliability of the functional device can be enhanced. During dry etching, the precipitates can be removed while being sputtered with an inert gas ion to allow slow progress of reaction. Further, there occurs no deterioration of device characteristics due to precipitation of reaction products. The term "etching" as used herein is meant to indicate not only chemical etching involving chemical reaction but also physical etching such as cutting involving ion bombardment.

In the invention, the low speed etching step may be preceded by a step of treating with a reducing plasma.

In this arrangement, the precipitates can be reduced and removed before patterning. Thus, the deterioration of device characteristics due to precipitation of reaction products can be prevented.

In the invention, the reducing plasma may comprises atoms or molecules comprising at least one element selected from carbon (C), hydrogen (H), nitrogen (N), sulfur (S), iodine (I), chlorine (Cl) and bromine (Br).

In this arrangement, the reliability of the functional device can be further enhanced.

In the invention, the reducing plasma may comprise at least one molecule selected from the group consisting of carbon monoxide (CO), hydrogen ($H_2$), nitrogen monoxide (NO), sulfur monoxide (SO), iodine ($I_2$), chlorine ($Cl_2$) and bromine ($Br_2$).

In this arrangement, a stacked type functional device can be formed, making it possible to further enhance the reliability of the functional device.

In the invention, the treatment with a reducing plasma may be followed by a step of etching by irradiation with argon ion.

In this arrangement, the treatment with a reducing plasma can provide a metal-rich electrode layer, if it is made of a metal. Such a metal-rich electrode layer can be easily etched with argon ion. Thus, etching can be easily effected without raising the temperature. A metal oxide layer such as ITO can be treated with a reducing plasma such as hydrogen plasma to form a metal-rich layer that can be easily removed with argon ion.

In the method of producing a functional device according to the invention, the second light-transmitting electrode comprises at least one of ITO, IZO, $SnO_2$, ATO, ZnO, and FTO, and the first light-transmitting electrode comprises at least one of In, W, TaN, Nb, Pt, and Ga.

By this method, it is possible to prevent the deterioration of photoelectric conversion characteristics of the functional device.

In the method of producing a functional device according to the invention, a supplied electric power at the time of etching is from 100 W to 4 kW.

By this method, it is possible to prevent the deterioration of photoelectric conversion characteristics of the functional device.

In the method of producing a functional device according to the invention, a chamber internal pressure at the time of etching is from 0.01 Pa to 50 Pa.

By this method, it is possible to prevent the deterioration of photoelectric conversion characteristics of the functional device.

In the method of producing a functional device according to the invention, a hard mask containing at least one of $SiO_2$ and $SiN_x$ is used in the patterning step.

By this method, it is possible to prevent the deterioration of photoelectric conversion characteristics of the functional device.

The method of producing a solid-state image pickup device according to the invention is a method of producing a solid-state image pickup device comprising: a substrate having a signal reading circuit formed thereon; and a functional device which contains a photoelectric conversion layer containing an organic material stacked above the substrate and a light-transmitting electrode stacked on the photoelectric conversion layer, wherein the functional device is prepared by the production method as set forth previously.

A photoelectric conversion device according to the invention is a photoelectric conversion device comprising a photoelectric conversion layer containing an organic material; and a light-transmitting electrode stacked on the photoelectric conversion layer, wherein the light-transmitting electrode comprises a first light-transmitting electrode and a second light-transmitting electrode stacked on the first light-transmitting electrode.

In the functional device according to the invention, the first light-transmitting electrode comprises at least one of In, W, TaN, Nb, Pt, and Ga, and the second light-transmitting electrode comprises at least one of ITO, IZO, $SnO_2$, ATO, ZnO, and FTO.

The solid-state image pickup device according to the invention is a solid-state image pickup device comprising a substrate having a signal reading circuit formed thereon and a functional device stacked on the substrate, wherein the functional device is the functional device as set forth previously.

According to the invention, it is possible to provide a functional device comprising a stack of a photoelectric conversion layer containing an organic material and a light-transmitting electrode without deteriorating photoelectric conversion characteristics of the photoelectric conversion layer and a method of producing the same.

DETAILED DESCRIPTION OF THE INVENTION

Embodiments of the invention will be described hereinafter in connection with the attached drawings.

Figure 1:
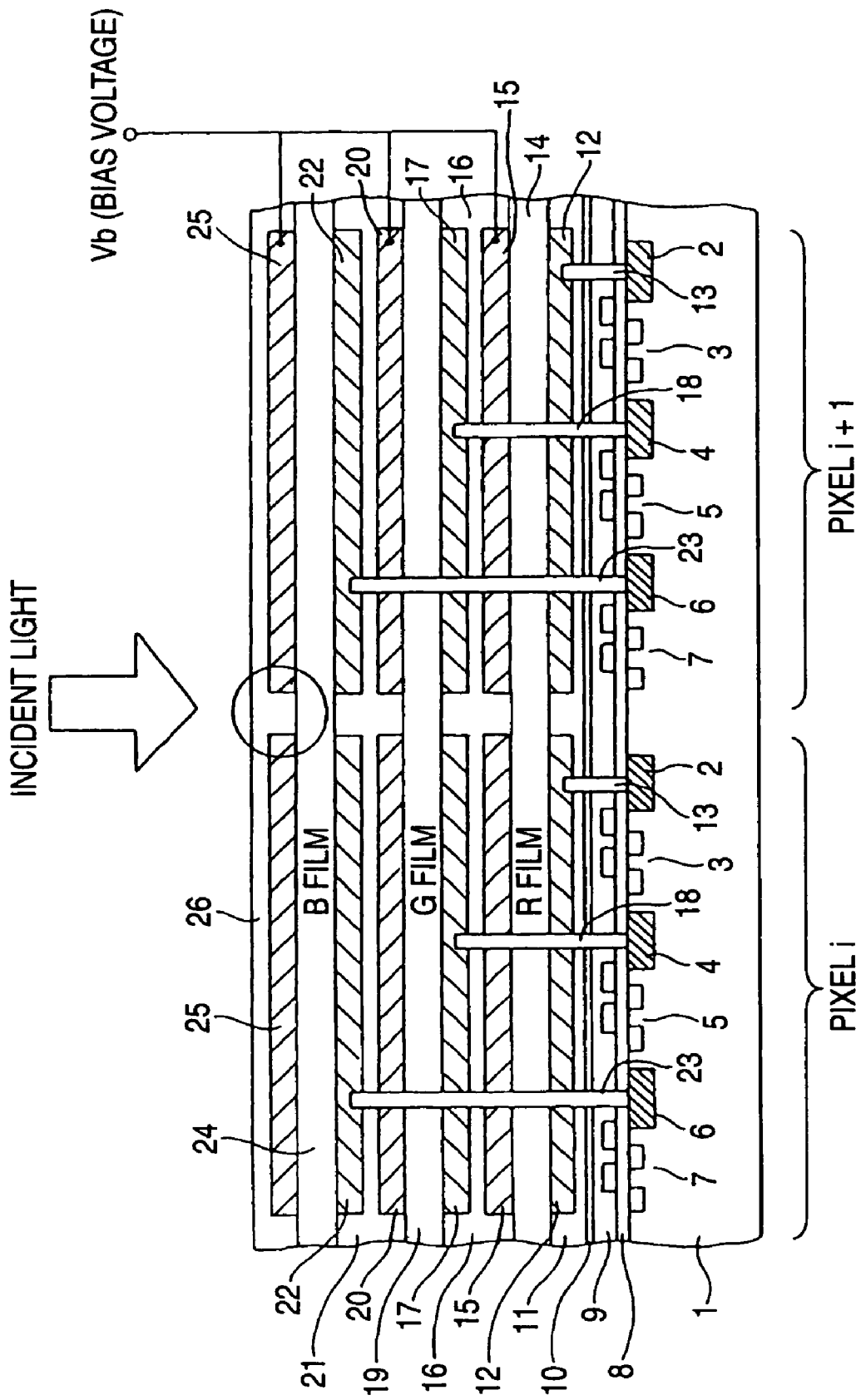
FIG. 1 is a cross-sectional schematic view of a part of two pixels of a photoelectric conversion layer stacked type solid-state image pickup device according to an embodiment of the invention.

FIG. 1 is a diagrammatic sectional view of a two pixel portion of a photoelectric conversion layer stacked type solid-state image pickup device according to an embodiment of the invention. In the present embodiment, three layers of photoelectric conversion layers are stacked. In this arrangement, electric signals corresponding to three primaries, i.e., red (R), green (G) and blue (B) can be taken. In other words, a color image can be imaged. The step of patterning a light-transmitting electrode layer 11 formed by an organic material layer in the upper part of the photoelectric conversion layer in this stacked structure involves a high speed etching step of etching the light-transmitting electrode layer at a rate of 10 nm/min or more.

The photoelectric conversion layer stacked type solid-state image pickup device of the invention may comprise only one photoelectric conversion layer so that a monochromatic image such as black-and-white image can be imaged.

Further, a construction in which four or more layers of photoelectric conversion layers are formed; besides the three primary colors of red, green and blue colors, for example, an intermediate color between blue and green colors (an emerald color corresponding to negative sensitivity among red luminosity factors of a human being) is detected; and a red detected signal is corrected by a detected signal of this intermediate color may be employed.

In FIG. 1, a red signal-accumulating high-concentration impurity region 2, a red signal-reading MOS circuit 3, a green signal-accumulating high-concentration impurity region 4, a green signal-reading MOS circuit 5, a blue signal-accumulating high-concentration region 6, and a blue signal-reading MOS circuit 7 are formed in a surface portion of a P well layer 1 as formed on an n-type silicon substrate.

Each of the respective MOS circuits 3, 5 and 7 comprises an impurity region for source and drain as formed on the surface of a semiconductor substrate and a gate electrode as formed via a gate insulating layer 8. An insulating layer 9 is deposited in the upper portion of the gate insulating layer 8 and the gate electrode and then flattened. A light-shielding layer 10 is formed on the surface of this insulating layer 9. In many cases, the light-shielding layer 10 is formed of a metallic thin layer, and therefore, an insulating layer 11 is further deposited thereon. In the case where the light-shielding layer 10 is not provided in this place, the insulating layers 9 and 11 illustrated in the drawing may be integrated.

Signal charges of respective colors (red, green and blue colors) generated in respective photoelectric conversion layers 14, 19 and 24 described later are accumulated in the foregoing color signal-accumulating high-concentration impurity regions 2, 4 and 6, respectively; and signals each corresponding to the quantity of the signal charge are read out by the MOS circuits 3, 5 and 7, respectively and taken out externally by reading electrodes (not illustrated) formed on the semiconductor substrate. The construction is the same as in the related art CMOS type image sensor.

Also, though this example is constructed such that signals each corresponding to the quantity of the signal charge are read out by the MOS circuits formed on the semiconductor substrate, a construction in which the accumulated charges in the color signal-accumulating high-concentration impurity regions 2, 4 and 6 are moved along a vertical transfer path likewise the related art CCD type image sensor and read out externally along a horizontal transfer path may be employed.

The foregoing construction is produced by the related art semiconductor method of CCD type image sensor and CMOS type image sensor, and by adding a construction as described later, a photoelectric conversion layer stacked type solid-state image pickup device is produced.

A light-transmitting electrode layer 12 is formed on the insulating layer 11 as shown in FIG. 1. The light-transmitting electrode layer 12 is formed of a single sheet construction and then separated for every pixel by etching. The light-transmitting electrode layer (red pixel electrode layer) 12 of each pixel is conducted to the red signal-accumulating high-concentration impurity region 2 by an electrode 13. The electrode 13 is electrically insulated from portions other than the red pixel electrode layer 12 and the high-concentration impurity region 2.

Then, for example, a red color-detecting photoelectric conversion layer 14 is formed in the upper portion of the red pixel electrode layer 12, and a light-transmitting electrode layer (a counter electrode layer opposing to the pixel electrode layer 12) 15 is further formed in the upper portion thereof. The counter electrode layer 15 is formed and then subjected to patterning in a desired shape (for example, a shape as separated for every pixel). That is, this is constructed such that the red color-detecting photoelectric conversion layer 14 is interposed by a pair of the light-transmitting electrode layers 12 and 15. The electrode layer 12 which is a lowermost layer may be formed by a non-light transmitting material to act as a light-shielding layer as well. In the present embodiment, the light-transmitting electrode layers 12, 15 and the red color-detecting photoelectric conversion layer 14 together act as a photoelectric conversion element.

A light-transmitting insulating layer 16 is formed in the upper portion of the counter electrode layer 15, and a light-transmitting electrode layer 17 is further formed in the upper portion thereof. The light-transmitting electrode layer 12 is formed of a single sheet construction and then separated for every pixel by etching. The light-transmitting electrode layer (green pixel electrode layer) 17 of each pixel is connected to the green signal-accumulating high-concentration impurity region 4 by a contact plug 18. This electrode 18 is electrically insulated from portions other than the green pixel electrode layer 17 and the high-concentration impurity region 4.

For example, a green color-detecting photoelectric conversion layer 19 is formed in the upper portion of the green pixel electrode layer 17, and a light-transmitting electrode layer (a counter electrode layer) 20 is further formed in the upper portion thereof. The counter electrode layer 20 is formed and then subjected to patterning in a desired shape (for example, a shape as separated for every pixel). That is, this is constructed such that the green color-detecting photoelectric conversion layer 19 is interposed by a pair of the light-transmitting electrode layers 17 and 20. In this embodiment, the light-transmitting electrode layers 17 and 20 and the green color-detecting photoelectric conversion layer 19 function as one photo-electric conversion device.

A light-transmitting insulating layer 21 is formed in the upper portion of the counter electrode layer 20, and a light-transmitting electrode layer 22 is further formed in the upper portion thereof. The light-transmitting electrode layer 22 is formed of a single sheet construction and then separated for every pixel by etching. The light-transmitting electrode layer (blue pixel electrode layer) 22 of each pixel is connected to the blue signal-accumulating high-concentration impurity region 6 by a contact plug 23. This electrode 23 is electrically insulated from portions other than the blue pixel electrode layer 22 and the high-concentration impurity region 6.

For example, a blue color-detecting photoelectric conversion layer 24 of a single sheet construction is formed in the upper portion of the blue pixel electrode layer 22, and a light-transmitting electrode layer (a counter electrode layer) 25 is further formed in the upper portion thereof. The counter electrode layer 25 is formed and then subjected to patterning in a desired shape (for example, a shape as separated for every pixel). That is, this is constructed such that the blue color-detecting photoelectric conversion layer 24 is interposed by a pair of the light-transmitting electrode layers 22 and 25. Then, a light-transmitting insulating layer 26 for passivation is provided in the uppermost layer. In this embodiment, the light-transmitting electrode layers 22 and 25 and the blue color-detecting photoelectric conversion layer 24 function as one photoelectric conversion device.

Examples of materials of the uniform light-transmitting electrode layers 12, 15, 17, 20, 22 and 25 include semi-transmitting electrode layers having a thin thickness, which are made of a conductive metal oxide (for example, tin oxide, zinc oxide, indium oxide, indium zinc oxide (IZO), and indium tin oxide (ITO)) or a metal (for example, gold, platinum, chromium, and nickel); mixtures or stacks of the foregoing metal and conductive metal oxide; inorganic conductive substances (for example, copper iodide and copper sulfide); organic conductive materials (for example, polyanilines, polythiophenes, and polypyrroles); and stacks thereof with ITO. Also, ones described in detail in *Development of light-transmitting Conductive Films*, edited by Yutaka Sawada (published by CMC Publishing Co., Ltd., 1999), *Technologies of light-transmitting Conductive Films*, written by Japan. Society for the Promotion of Science (published by Ohmsha, Ltd., 1999), and so on may be used. Of these, at least one material selected from ITO, IZO, $SnO_2$, ATO, ZnO, FTO and the like is especially preferable. A transmittance of the light-transmitting electrode layer is preferably from 60% to 98%, and more preferably from 80% to 98%. Examples of a method for forming the light-transmitting electrode layer include a laser abrasion method and a sputtering method. Incidentally, FIG. 1 describes the case where the light-transmitting electrode layer is of a single-layer structure.

The photoelectric conversion layers 14, 19 and 24 are each constructed while containing an organic material such as organic semiconductors. Examples pf the organic semiconductor include hole transport materials and electron transport materials. Examples of the hole transport material which can be used include poly-N-vinylcarbazole derivatives, polyphenylenevinylene derivatives, polyphenylenes, polythiophenes, polymethylphenylsilanes, polyanilines, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, carbazole derivatives, styrylanthracene derivatives, fluorenone derivatives, hydrazone derivatives, stilbene derivatives, porphyrin derivatives (for example, phthalocyanine), aromatic tertiary amine compounds, styrylamine compounds, butadiene compounds, benzidine derivatives, polystyrene derivatives, triphenylmethane derivatives, tetraphenylbenzene derivatives, and starburst polyamine derivatives. Also, examples of the electron transport organic material include oxadiazole derivatives, triazole derivatives, triazine derivatives, nitro-substituted fluorenone derivatives, thiopyran dioxide derivatives, diphenylquinone derivatives, perylenetetracarboxyl derivatives, anthraxquinonedimethane derivatives, fluorenylidenemethane derivatives, anthrone derivatives, perynone derivatives, oxine derivatives, and quinoline complex derivatives.

Also, organic dyes may be used as the organic material. Examples of the organic dye which can be suitably used include metal complex dyes, cyanine based dyes, merocyanine based dyes, phenylxanthene based dyes, triphenylmethane based dyes, rhodacyanine based dyes, xanthene based dyes, large cyclic azaannulene based dyes, azulene based dyes, naphthoquinone based dyes, anthraquinone based dyes, chain compounds resulting from condensation of a fused polycyclic aromatic compound and an aromatic or heterocyclic compound such as anthracene and pyrene, two nitrogen-containing heterocyclic compounds having a squalium group and a croconic methine group as binding chains such as quinoline, benzothiazole, and benzoxazole, and cyanine based analogous dyes bound by a squalium group and a croconic methine group. In the case where the organic dye is a metal complex dye, dithiol metal complex based dyes, metallic phthalocyanine dyes, metallic porphyrin dyes, and ruthenium complex dyes are preferable; and ruthenium complex dyes are especially preferable. Examples of the ruthenium complex dye include complex dyes described in U.S. Pat. Nos. 4,927,721, 4,684,537, 5,084,365, 5,350,644, 5,463, 057 and 5,525,440, JP-A-7-249790, JP-T-10-504512, WO 98/50393, and JP-A-2000-26487. Further, specific examples of polymethine dyes such as cyanine dyes, merocyanine dyes, and squalium dyes include dyes described in JP-A-11-35836, JP-A-11-67285, JP-A-11-86916, JP-A-11-97725, JP-A-11-158395, JP-A-11-163378, JP-A-11-214730, JP-A-11-214731, JP-A-11-238905, JP-A-2000-26487, and European Patent Nos. 892,411, 911,841 and 991,092.

The patterning step of the counter electrode layer 25 will be described below. Since the patterning step of the counter electrode layers 15 and 20 is the same as the patterning step of the counter electrode layer 25, its description is omitted.

Figure 2:
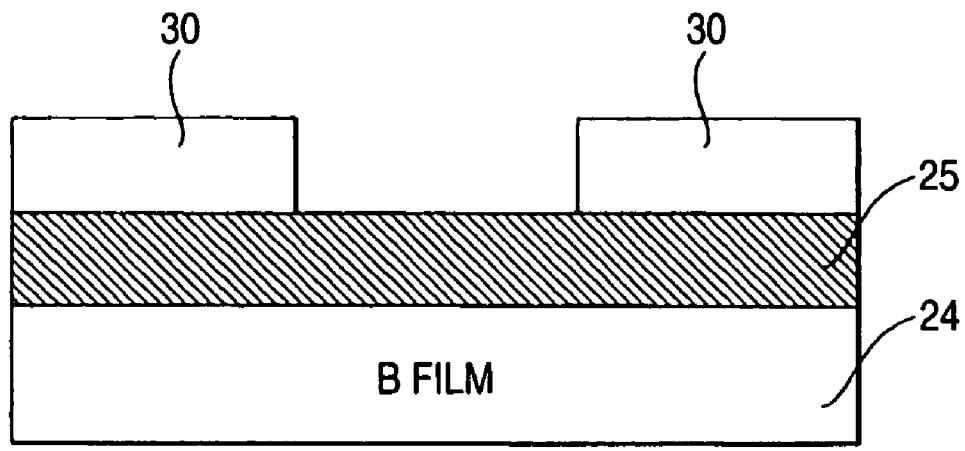
FIG. 2 is a view to explain a patterning step of a counter electrode layer.
Figure 2:
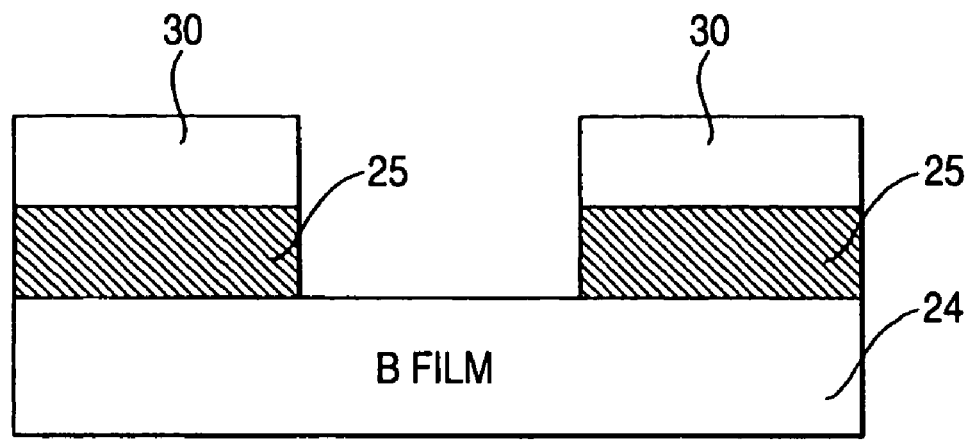

FIG. 2 is a view to explain the patterning step of the counter electrode layer in a portion surrounded by a circle as shown in FIG. 1.

As shown in FIG. 2, the step of patterning the opposing electrode layer 25 comprises depositing an opposing electrode layer 25 on a blue color-detecting photoelectric conversion layer 24, forming a thin layer containing at least one of $SiO_2$ and $SiN_x$ by CVD method, and then patterning the thin layer with a resist pattern formed by photolithography (not shown) as a mask to form a hard mask 30 formed by a thin layer containing at least one of $SiO_2$ and $SiN_x$ (FIG. 2(a)). FIG. 2(a) depicts the state in which the resist pattern has been ashed away. Thereafter, the opposing electrode layer is etched with the hard mask as a mask. The thickness of the opposing electrode layer 25 is, e.g., 0.15 µm. The term "etching" as used in the present embodiment is meant to indicate dry etching such as chemical etching and sputtering.

In the etching step, the counter electrode layer 25 is subjected to a high-speed etching step at an etching rate of 10 nm/min or more (hereinafter referred to as "first etching rate") such that it is etched to the surface of the blue color-detecting photoelectric conversion layer 24 (FIG. 2(b)); and after terminating the high-speed etching step, the hard mask 30 is peeled away, thereby terminating the patterning step. The etching rate can be adjusted by the kind of the etchant gas, the material constituting the opposing electrode layer 25, the electric power supplied during etching, the pressure in the chamber during etching, etc. When the etchant gas is introduced over an extended period of time during the etching of the light-transmitting electrode stacked on the photoelectric conversion layer containing an organic material, the photoelectric conversion layer containing an organic material is damaged, resulting in the deterioration of the photoelectric conversion characteristics. By effecting the etching at a rate of 10 nm/min or more so that the etching is terminated in such a period of time that the photoelectric conversion layer cannot be damaged as in the present embodiment, the damage of the photoelectric conversion layer can be minimized, making it possible to prevent the deterioration of the photoelectric conversion characteristics. In other words, an important point of the invention is that in the case where the photoelectric conversion layer contains an organic material, the light-transmitting electrode is etched at a rate of 10 nm/min or more so that the photoelectric conversion characteristics of the photoelectric conversion layer cannot be impaired to prevent the deterioration of the organic material or the interfacial reaction of the organic material with the electrode layer at the etching step.

Incidentally, when the foregoing etching rate is made not constant and a low-speed etching step for carrying out etching while making the etching rate lower than the first etching rate is added immediately before termination of the etching, it is possible to more enhance the photoelectric conversion characteristics of the photoelectric conversion device containing the pixel electrode layer 22, the photoelectric conversion layer 24 and the counter electrode layer 25.

In other words, in the patterning step, the high-speed etching step for etching the counter electrode layer 25 at the first etching rate (for example, 10 nm/min) is first carried out to an extent that the damage of the blue color-detecting photoelectric conversion layer 24 is tolerable, thereby terminating the etching in the state that the counter electrode layer 25 is retained in a prescribed amount (for example, $\frac{1}{15}$ of the thickness of the counter electrode layer 25); and after regulating the etching rate at a second etching rate which is lower than the first etching rate (for example, 1 nm/min which is $\frac{1}{10}$ of the first etching rate), the low-speed etching step for etching the remaining counter electrode layer 25 which has not been etched in the high-speed etching step to the surface of the blue color-detecting photoelectric conversion layer 24 is carried out. In this way, by dividing the etching step into two stages of the high-speed etching step and the low-speed etching step and making the etching rate low in the position in the vicinity of the photoelectric conversion layer 24, it is possible to further prevent the damage of the photoelectric conversion layer and to further prevent the deterioration of the photoelectric conversion characteristics.

At the low speed etching step, the opposing electrode layer which has been treated with a reducing plasma, i.e., plasma containing a reducing molecule or atom is preferably subjected to dry etching with at least one gas selected from the group consisting of HCl, HBr, HI, $CH_4$, $CH_3OH$, Ar, $N_2$, Xe, Kr and $O_2$. More preferably, the reducing plasma contains atoms or molecules containing at least one element selected from the group consisting of carbon, hydrogen, nitrogen, sulfur, iodine, chlorine and bromine. Even more preferably, the plasma containing reducing molecules or atoms contains at least one molecule selected from the group consisting of carbon monoxide, hydrogen, nitrogen monoxide, sulfur monoxide, iodine, chlorine and bromine, most preferably carbon monoxide or hydrogen. It should be specially mentioned in the invention that these molecules are not necessarily needed to be supplied in the form of gas. It is made obvious that when an oxide is subjected to treatment with an etching gas $CHF_3$ as a plasma-producing gas, i.e., plasma treatment with $CHF_3$ plasma, carbon monoxide occurs under ordinary conditions. This is because the oxygen in the oxide and the carbon in $CHF_3$ react with each other to produce carbon monoxide. The invention is effective also in the case where molecules which have been produced at the plasma treatment step and thus occur in the plasma are used.

The treatment with a reducing plasma can provide a metal-rich electrode layer, if it is made of a metal. Such a metal-rich electrode layer can be easily etched with argon ion. Thus, etching can be easily effected without raising the temperature. A layer made of metal oxide such as ITO can be treated with a reducing plasma such as hydrogen plasma to form a metal-rich layer that can be easily removed with argon ion.

It was made obvious that the treatment with a reducing plasma, i.e., plasma containing a reducing molecule or atom during dry etching with at least one gas selected from the group consisting of HCl, HBr, HI, $CH_4$, $CH_3OH$, Ar, $N_2$ and $O_2$, which treatment is one of the characteristics of the invention, makes it possible to maintain the etching rate that has never been attained at a substrate temperature of 150° C. or less and make a contribution to the enhancement of durability of the functional device containing an organic semiconductor. It is thought that the effect of dry etching method in the invention remains the same regardless of whichever the inductively coupled type dry etching or the capacitor coupled type dry etching is employed.

Figure 3:
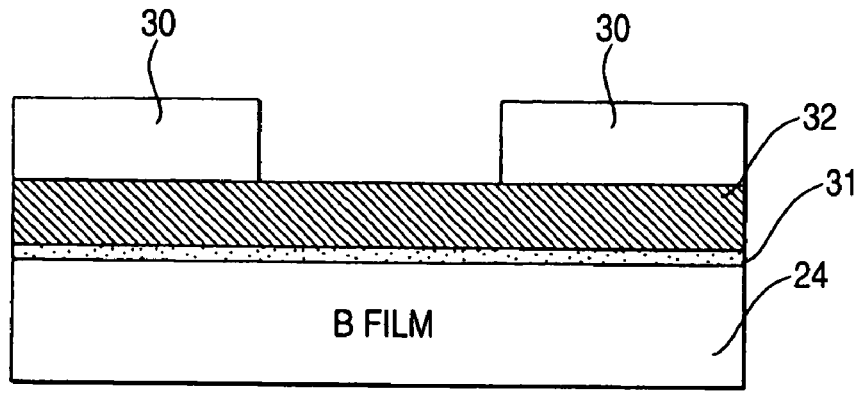
FIG. 3 is a view to explain a patterning step of a counter electrode layer.
Figure 3:
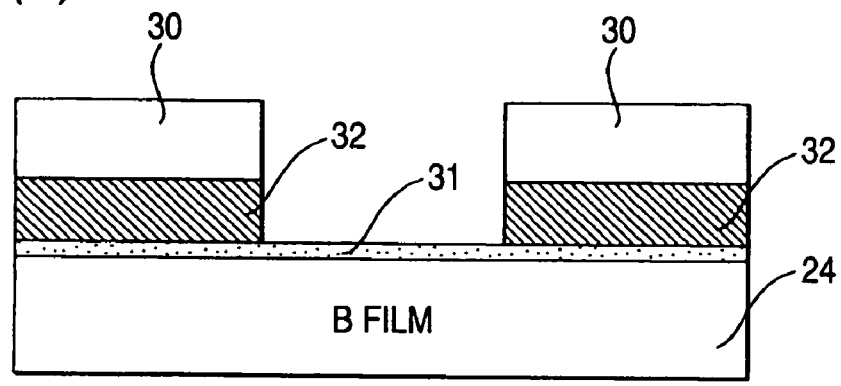
Figure 3:
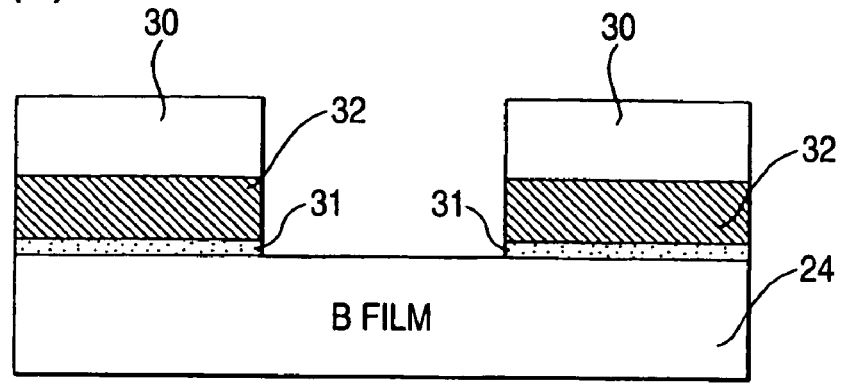

While an example in which one counter electrode layer is stacked on the photoelectric conversion layer has been described above, the counter electrode layer may be made of a double-layer structure. In this case, for example, as shown in FIG. 3, by making the counter electrode layer 25 have a double-layer structure consisting of a first counter electrode layer 31 and a second counter electrode layer 32 stacked on the first counter electrode layer 31, etching may be carried out while changing the etching rate between the first counter electrode layer 31 and the second counter electrode layer 32. The patterning step of the counter electrode layer of the structure shown in FIG. 3 will be described below.

FIG. 3 is a view to explain the patterning step of the counter electrode layer of a photoelectric conversion layer stacked type image pickup device of this embodiment.

The first counter electrode layer 31 is first formed in the upper portion of the photoelectric conversion layer 24; and the second counter electrode layer 32 is formed in the upper portion of the first counter electrode layer 31; and the step is then shifted into the patterning step. In the patterning step, a hard mask 30 is formed of a material containing at least one of $SiO_2$ and $SiN_x$ (FIG. 3(a)) in the upper portion of the second counter electrode layer 32; and the step is then shifted into the etching step. Here, a thickness of the first counter electrode layer 31 is, for example, 10 nm; and a thickness of the second counter electrode layer 32 is, for example, 0.15 μm. While the material of the first counter electrode layer 31 may be made identical with the material of the counter electrode layer 25, it is preferably a material having resistance to a halogen based etchant, that is, an etchant containing Cl, Br, or I (for example, HCl, HBr, HI, $BCl_3$, and $Cl_2$). Examples of such a material include In, W, TaN, Nb, Pt, Ga, TiN, and ZrN. Of these, at least one material selected from In, W, TaN, Nb, Pt, and Ga is especially preferable. As the material of the second counter electrode layer 32, the same material as in the counter electrode layer 25 can be used. When the first counter electrode layer 31 and the second counter electrode layer 32 are stacked, a light transmittance is preferably from 60% to 98%, and more preferably from 80% to 98%.

In the etching step, the high-speed etching step for etching the second counter electrode layer 32 to the surface of the first counter electrode layer 31 at the first etching rate is carried out by using the first etchant gas under the same condition except for making only an etchant gas species variable (FIG. 3(b)); and simultaneously with the termination of the high-speed etching step, the low-speed etching step for etching the second counter electrode layer 32 to the surface of the blue color-detecting photoelectric conversion layer 24 at the second etching rate is carried out by switching the first etchant gas to the second etchant gas and using this second etchant gas (FIG. 3(b)), thereby terminating the etching step.

In this etching step, the first etchant gas species may be previously determined such that the etching rate in the high-speed etching step is the first etching rate, and the second etchant gas species may be previously determined such that the etching rate in the low-speed etching step is the second etching rate. In this way, by making the counter electrode layer have a double-layer structure, it becomes easy to switch the etching rate, thereby enabling one to simplify the production process.

Incidentally, any gas which is useful for dry etching can be used as the first etchant gas, but any one of HI, HBr, HCl, $CH_4$, and $CH_3OH$, or a mixed gas of at least two gases selected from these members is preferably used. Any gas which is useful for dry etching can be used as the second etchant gas, but any one of $CH_4$, $CH_3OH$, $BCl_3$, and $Cl_2$, or a mixed gas of at least two gases selected from these members is preferably used.

In the patterning step as described in FIG. 3, only the etchant gas species is made variable. However, it is also possible to minutely control the etching rate by making the supplied electric power at the time of etching or the chamber internal pressure at the time of etching variable. Further, even in the case where all of the etching conditions (for example, the supplied electric power, the chamber internal pressure, and the etchant gas species) are made identical, it is possible to control the etching rate by a combination of materials of the first counter electrode layer 31 and the second counter electrode layer 32. In any way, by etching the second counter electrode layer 32 at the first etching rate and etching the first counter electrode layer 31 at the second etching rate, it is possible to prevent the deterioration of the photoelectric conversion characteristics of the photoelectric conversion device.

Incidentally, the supplied electric power at the time of etching is preferably from 100 W to 4 kW. The chamber internal pressure at the time of etching is preferably from 0.01 Pa to 50 Pa.

Further, in a photoelectric conversion device constructed of two light-transmitting electrodes and a photoelectric conversion layer interposed therebetween, the patterning step of this embodiment is effective in the case of subjecting the light-transmitting electrodes stacked on the photoelectric conversion layer to patterning. The photoelectric conversion device as referred to herein includes one for converting electricity into light (for example, organic EL devices) in addition to one for converting light into electricity. Namely, the patterning step of this embodiment can be also applied to the production process of an organic EL display device and the like in addition to a photoelectric conversion layer stacked type solid-state image pickup device.

As mentioned above, in accordance with the method of the invention, the electrode layer can be patterned without causing the deterioration of the element characteristics. Thus, the method of the invention can be used to the formation of various functional devices such as a stacked type solid-state image pickup device.

What is claimed is:

1. A method of producing a functional device comprising a light-transmitting electrode layer provided as an upper layer of a layer containing an organic material, the layer being as a functional layer, wherein a step of patterning the light-transmitting electrode layer comprises a high speed etching step of etching the electrode layer at a rate of 10 nm/min or more;
   wherein the etchant gas to be used at the high speed etching step comprises at least one of hydrogen iodide (HI), hydrogen bromide (HBr), hydrogen chloride (HCl), methane ($CH_4$) and methanol ($CH_3OH$);
   wherein the high speed etching step is terminated with the light-transmitting electrode left unetched in a predetermined amount and the patterning step comprises a low speed etching step of etching the remaining light-transmitting electrode at a rate lower than 10 nm/min after the high speed etching step;
   wherein the slow speed etching step is preceded by a step of etching by irradiation with argon ion.

2. The method of producing a functional device as defined in claim 1, wherein the light-transmitting electrode comprises at least one of indium tin oxide (ITO), indium zinc oxide (IZO), tin oxide (SnO2), ATO, zinc oxide (ZnO) and FTO.

3. The method of producing a functional device as defined in claim 1, wherein the etchant gas to be used at the low speed etching step comprises at least one of HI, HBr, HCl, CH4, CH3OH, boron chloride (BCl3) and chlorine (Cl2).

4. The method of producing a functional device as defined in claim 1, wherein the light-transmitting electrode comprises a first light-transmitting electrode and a second light-transmitting electrode stacked on the first light-transmitting electrode, the high speed etching step involves etching of the second light-transmitting electrode and the low speed etching step involves etching of the first light-transmitting electrode.

5. The method of producing a functional device as defined in claim 4, wherein the first light-transmitting electrode comprises a material having an etching resistance to an etchant containing halogen.

6. The method of producing a functional device as defined in claim 3, wherein the low speed etching step is preceded by a step of treating with a reducing plasma.

7. The method of producing a functional device as defined in claim 6, wherein the reducing plasma comprises atoms or molecules comprising at least one element selected from carbon (C), hydrogen (H), nitrogen (N), sulfur (S), iodine (I), chlorine (Cl) and bromine (Br).

8. The method of producing a functional device as defined in claim 6, wherein the reducing plasma comprises at least one molecule selected from carbon monoxide (CO), hydrogen (H2), nitrogen monoxide (NO), sulfur monoxide (SO), iodine (I2), chlorine (Cl2) and bromine (Br2).

9. The method of producing a functional device as defined in claim 1, wherein the electric power supplied at the time of etching is from not lower than 100 W to not higher than 4 kW.

10. The method of producing a functional device as defined in claim 1, wherein the pressure in the chamber during etching is from not lower than 0.01 Pa to not higher than 50 Pa.

11. The method of producing a functional device as defined in claim 1, wherein the patterning step involves the use of a hard mask containing at least one of silicon oxide (SiO2) and silicon nitride (SiNx).

12. A method of producing a solid-state image pickup device comprising: a substrate having a signal reading circuit formed thereon; and a functional device which contains a photoelectric conversion layer containing an organic material stacked on the substrate and a light-transmitting electrode stacked on the photoelectric conversion layer, wherein the functional device is prepared by the production method as defined in claim 1.

13. The method of producing a functional device as defined in claim 1, wherein the low speed etching rate is approximately 1 nm/min.

14. The method of producing a functional device as defined in claim 1, wherein the low speed etching rate is 1 nm/min or less.

15. A method of producing a functional device comprising an electrode layer provided as an upper layer of a layer containing an organic material, the layer being as a functional layer, wherein a step of patterning the electrode layer comprises a high speed etching step of etching the electrode layer at a rate of 10 nm/min or more;
    wherein the high speed etching step is terminated with the light-transmitting electrode left unetched in a predetermined amount and the patterning step comprises a low speed etching step of etching the remaining light-transmitting electrode at a rate lower than that of the high speed etching step after the high speed etching step;
    wherein the etchant gas to be used at the low speed etching step comprises at least one of HI, HBr, HCl, CH4, CH3OH, boron chloride (BCl3) and chlorine (Cl2);
    wherein the low speed etching step is preceded by a step of treating with a reducing plasma;
    wherein the treatment with a reducing plasma is followed by a step of etching by irradiation with argon ion.

16. A method of producing a functional device comprising an electrode layer provided as an upper layer of a layer containing an organic material, the layer being as a functional layer, wherein a step of patterning the electrode layer comprises a high speed etching step of etching the electrode layer at a rate of 10 nm/min or more;
    wherein the high speed etching step is terminated with the light-transmitting electrode left unetched in a predetermined amount and the patterning step comprises a low speed etching step of etching the remaining light-transmitting electrode at a rate lower than that of the high speed etching step after the high speed etching step;
    wherein the light-transmitting electrode comprises a first light-transmitting electrode and a second light-transmitting electrode stacked on the first light-transmitting electrode, the high speed etching step involves etching of the second light-transmitting electrode and the low speed etching step involves etching of the first light-transmitting electrode;
    wherein the second light-transmitting electrode comprises at least one of ITO, IZO, SnO2, ATO, ZnO and FTO and the first light-transmitting electrode comprises at least one of indium (In), tungsten (W), tantalum nitride (TaN), niobium (Nb), platinum (Pt) and gallium (Ga).

* * * * *